United States Patent
Otsubo et al.

(10) Patent No.: US 9,402,307 B2
(45) Date of Patent: Jul. 26, 2016

(54) RIGID-FLEXIBLE SUBSTRATE AND METHOD FOR MANUFACTURING THE SAME

(71) Applicant: Murata Manufacturing Co., Ltd., Nagaokakyo-shi, Kyoto-fu (JP)

(72) Inventors: Yoshihito Otsubo, Nagaokakyo (JP); Takayoshi Yoshikawa, Nagaokakyo (JP); Akinori Takezawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 74 days.

(21) Appl. No.: 14/055,109

(22) Filed: Oct. 16, 2013

(65) Prior Publication Data

US 2014/0034366 A1 Feb. 6, 2014

Related U.S. Application Data

(63) Continuation of application No. PCT/JP2012/059321, filed on Apr. 5, 2012.

(30) Foreign Application Priority Data

Apr. 26, 2011 (JP) .................................. 2011-098246

(51) Int. Cl.
*H05K 1/00* (2006.01)
*H05K 1/02* (2006.01)
*H05K 3/46* (2006.01)

(52) U.S. Cl.
CPC ............ *H05K 1/0278* (2013.01); *H05K 3/4691* (2013.01); *H05K 2201/0129* (2013.01); *H05K 2201/09827* (2013.01); *H05K 2201/09845* (2013.01); *Y10T 428/24488* (2015.01)

(58) Field of Classification Search
CPC ......... H05K 1/0278; H05K 1/02; H05K 1/03; H05K 3/46; H05K 3/4691; H05K 2201/0187; H05K 2201/09827; H05K 2201/09845; H05K 2201/0129; H05K 2201/09154; H05K 2203/063; H05K 3/00; H05K 3/4602; H05K 3/4652; Y10T 428/24488
USPC ................ 174/254, 261; 156/308.2; 428/157; 439/493
See application file for complete search history.

(56) References Cited

U.S. PATENT DOCUMENTS

| 4,931,134 A * | 6/1990 | Hatkevitz et al. ................ 216/17 |
| 2004/0112632 A1* | 6/2004 | Michiwaki ........... H05K 3/4691 174/254 |

(Continued)

FOREIGN PATENT DOCUMENTS

| JP | 63-149561 U | 10/1988 |
| JP | 08-139454 A | 5/1996 |

(Continued)

OTHER PUBLICATIONS

Official Communication issued in International Patent Application No. PCT/JP2012/059321, mailed on Jun. 19, 2012.
Official Communication issued in corresponding Japanese Patent Application No. 2013-511988, mailed on Oct. 13, 2015.

*Primary Examiner* — Timothy Thompson
*Assistant Examiner* — Guillermo Egoavil
(74) *Attorney, Agent, or Firm* — Keating & Bennett, LLP

(57) ABSTRACT

A rigid-flexible substrate includes a plurality of rigid portions, and a flexible portion connecting the plurality of rigid portions and including a portion of a first resin sheet including at least one layer of a thermoplastic resin sheet, the rigid portions including a portion of the first resin sheet other than the flexible portion, and a second resin sheet including a plurality of thermoplastic resin sheets laminated on one surface or both surfaces of the portion of the first resin sheet other than the flexible portion, and a tapered portion is provided at an end edge of the second resin sheet on a side close to the flexible portion, and a thickness of the tapered portion in a direction in which the second resin sheet is laminated decreases toward the flexible portion and is substantially 0 at a position in contact with the flexible portion.

16 Claims, 2 Drawing Sheets

(56) References Cited

U.S. PATENT DOCUMENTS

| | | | | |
|---|---|---|---|---|
| 2007/0269665 | A1* | 11/2007 | Shimoohsako | B32B 15/08 428/458 |
| 2008/0289859 | A1* | 11/2008 | Mikado | H05K 1/0281 174/254 |
| 2011/0255850 | A1* | 10/2011 | Dinh | G03B 15/03 396/176 |
| 2012/0275124 | A1* | 11/2012 | Pludra et al. | 361/749 |

FOREIGN PATENT DOCUMENTS

| | | | |
|---|---|---|---|
| JP | 08139454 A | * | 5/1996 |
| JP | 2002-158445 A | | 5/2002 |
| JP | 2002-305382 A | | 10/2002 |
| JP | 2002305382 A | * | 10/2002 |
| JP | 2004-319962 A | | 11/2004 |
| JP | 2012182390 A | * | 9/2012 |

* cited by examiner

RIGID-FLEXIBLE SUBSTRATE AND METHOD FOR MANUFACTURING THE SAME

BACKGROUND OF THE INVENTION

1. Field of the Invention

The present invention relates to a rigid-flexible substrate and a method for manufacturing the same.

2. Description of the Related Art

In recent years, so-called printed substrates having a conductor wire layer formed on a surface of a thermoplastic resin sheet have been applied to packages incorporating circuit boards and semiconductor elements, and the like. In addition, as more layers of wires are laminated, conductor wire layers between different layers are electrically connected by a via conductor.

Further, rigid-flexible substrates formed by integrating a flexible printed substrate (flexible portion) and a rigid substrate (rigid portion) have been known. The rigid-flexible substrate generally has advantages in that it is excellent in component mounting properties because its rigid portion has rigidity equal to that of the rigid substrate, and that it can be incorporated into electronic equipment in a three dimensional manner and can also be applied to a hinge portion (bent portion) and the like because it has flexibility similar to that of the flexible substrate as a whole. Furthermore, the flexible substrate alone is very thin and difficult to handle, and thus requires a dedicated mounting facility, whereas the rigid-flexible substrate, whose rigid portion has high rigidity, also has advantages that an existing mounting facility for rigid substrates can be used and mounting density can also be increased.

Examples of a method for increasing hardness of a rigid portion include a method of using a hard material such as glass epoxy as a substrate material for a rigid portion, a method of setting a rigid portion to have a wire density higher than that of a flexible portion or to have more layers than those of a flexible portion in a substrate, and the like. Japanese Patent Laid-Open No. 2002-305382 discloses a rigid-flexible substrate fabricated by laminating thermoplastic resin sheets 3 having conductor wires (not shown) and via conductors 4 formed therein such that a rigid portion and a flexible portion have different numbers of laminated layers, and performing collective multilayer pressing on thermoplastic resin sheets 3 (FIG. 5). In this case, there has been a problem in that a crack, peel-off, or the like is likely to occur at a junction between the rigid portion and the flexible portion.

On the other hand, Japanese Patent Laid-Open No. 2004-319962 discloses a flex-rigid printed wiring board (rigid-flexible substrate) configured to connect a plurality of rigid substrates (such as FR-4 as glass epoxy substrates) having a wiring pattern, using a flexible portion composed of a resin sheet having insulation properties and flexibility. Japanese Patent Laid-Open No. 2004-319962 discloses that, by forming a chamfer at an end portion of such a rigid substrate (i.e., on a side connected to the flexible portion), repeated bending strength does not vary depending on the position, and a peel-off at a junction between a rigid portion and the flexible portion can be suppressed.

However, the method described in Japanese Patent Laid-Open No. 2004-319962 is a method of chamfering a printed wiring board having a certain degree of hardness (i.e., the rigid substrate such as glass epoxy substrate) by machining with a router. Accordingly, the flex-rigid printed wiring board described in Japanese Patent Laid-Open No. 2004-319962 is basically different from the rigid-flexible substrate having a rigid portion and a flexible portion formed to have different numbers of laminated layers as described in Japanese Patent Laid-Open No. 2002-305382. Further, in the method described in Japanese Patent Laid-Open No. 2004-319962, the printed wiring board is required to have hardness, and it is difficult to accurately polish a rigid-flexible substrate formed by laminating soft resin sheets. Furthermore, when a component is downsized, it is difficult to accurately polish the component by machining with a router, and manufacturing cost is also increased.

SUMMARY OF THE INVENTION

Preferred embodiments of the present invention provide a rigid-flexible substrate that prevents cracking, breaking or peeling-off of a conductor wire, in a boundary portion between a rigid portion and a flexible portion, and a method for manufacturing the same.

A preferred embodiment of the present invention is directed to a rigid-flexible substrate, including a plurality of rigid portions, and a flexible portion connecting the plurality of rigid portions, wherein the flexible portion includes a portion of a first resin sheet including at least one layer of a thermoplastic resin sheet, the rigid portion includes a portion of the first resin sheet other than the flexible portion, and a second resin sheet including a plurality of thermoplastic resin sheets laminated on one surface or both surfaces of the portion of the first resin sheet other than the flexible portion, and a tapered portion is located at an end edge of the second resin sheet on a side close to the flexible portion, and a thickness of the tapered portion in a direction in which the second resin sheet is laminated decreases toward the flexible portion and is substantially 0 at a position in contact with the flexible portion.

Preferably, a material for the thermoplastic resin sheet constituting the first resin sheet is identical to a material for the thermoplastic resin sheets constituting the second resin sheet.

Preferably, of the plurality of thermoplastic resin sheets constituting the second resin sheet, a thermoplastic resin sheet located farther from the first resin sheet has a longer distance from a boundary surface between the flexible portion and the rigid portion.

Preferably, a surface of the second resin sheet which is not in contact with the first resin sheet is entirely covered with an outermost thermoplastic resin sheet constituting the second resin sheet.

Preferably, a conductor wire is laminated on at least one surface or both surfaces of the thermoplastic resin sheet constituting the first resin sheet.

Preferably, a conductor wire is laminated on at least one surface or both surfaces of the thermoplastic resin sheets constituting the second resin sheet.

Further, another preferred embodiment of the present invention relates to a method for manufacturing a rigid-flexible substrate as described above, including the steps of laminating a second resin sheet including a plurality of thermoplastic resin sheets on a portion of at least one surface of a first resin sheet including at least one layer of a thermoplastic resin sheet, and collectively compression-bonding the thermoplastic resin sheets by thermocompression-bonding the laminated first resin sheet and second resin sheet, wherein, of the plurality of thermoplastic resin sheets constituting the second resin sheet, a thermoplastic resin sheet farther from the first resin sheet has a longer distance from a boundary surface between a flexible portion and a rigid portion, and the tapered portion is formed at an end edge of the second resin sheet on a side close to the flexible portion after thermocompression bonding.

A further preferred embodiment of the present invention relates to a method for manufacturing a rigid-flexible substrate as described above, including the steps of laminating a second resin sheet including a plurality of thermoplastic resin sheets on a portion of at least one surface of a first resin sheet including at least one layer of a thermoplastic resin sheet, and collectively compression-bonding the thermoplastic resin sheets by thermocompression-bonding the laminated first resin sheet and second resin sheet, wherein, of the plurality of thermoplastic resin sheets constituting the second resin sheet, an outermost thermoplastic resin sheet has a length in a direction perpendicular or substantially perpendicular to a boundary surface between a flexible portion and a rigid portion which is longer than that of another thermoplastic resin sheet constituting the second resin sheet, and the tapered portion is formed at an end edge of the second resin sheet on a side close to the flexible portion after thermocompression bonding.

According to various preferred embodiments of the present invention, by causing a portion of a thermoplastic resin constituting the rigid portion to flow toward the flexible portion, a boundary between the rigid portion and the flexible portion has a smooth shape without requiring special machining. Therefore, flex resistance and rupture strength of a boundary portion between the flexible portion and the rigid portion is greatly improved, while preventing cracking, breaking or peeling-off of the conductor wire, in the boundary portion between the rigid portion and the flexible portion.

Further, in a case where a material constituting the rigid portion is identical to a material constituting the flexible portion, the boundary between the rigid portion and the flexible portion has a smooth shape simultaneously by a process of compression-bonding the thermoplastic resin sheets by collective multilayer pressing, and thus, manufacturing cost is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
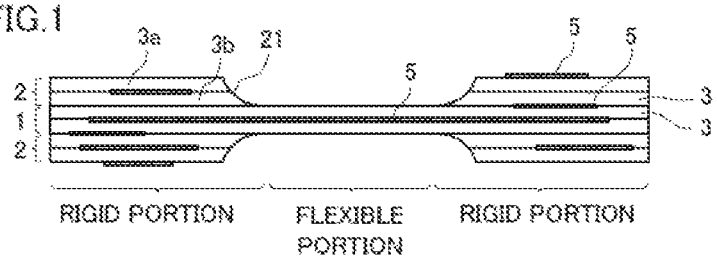
FIG. 1 is a schematic cross sectional view of a rigid-flexible substrate according to Preferred Embodiment 1 of the present invention.

Hereinafter, each constituent element of a rigid-flexible substrate in accordance with various preferred embodiments of the present invention will be described in detail.

A first resin sheet includes at least one layer of a thermoplastic resin sheet. The number of laminated layers of the thermoplastic resin sheet constituting the first resin sheet is preferably 1 to 10 layers, more preferably 2 to 8 layers, and further preferably 3 to 5 layers, for example.

A second resin sheet includes a plurality of thermoplastic resin sheets. The number of laminated layers of the thermoplastic resin sheets constituting the second resin sheet is preferably 2 to 10 layers, more preferably 2 to 8 layers, and further preferably 3 to 5 layers, for example.

The thermoplastic resin sheet includes at least a thermoplastic resin. Examples of the thermoplastic resin include polyimide, a liquid crystal polymer (LCP), a polyether ketone resin (PEEK), and a polyphenylene sulfide resin (PPS). The thermoplastic resin sheet is generally a sheet in the shape of a film or the like made of a material having electrical insulation properties, and is preferably made of a material which has flexibility and is bendable even after thermocompression bonding, for example.

In the rigid-flexible substrate in accordance with a preferred embodiment of the present invention, the same material for the thermoplastic resin sheet can be used for a rigid portion and a flexible portion. Accordingly, the rigid-flexible substrate which has no mismatch in properties such as a dielectric constant when compared with the one having mixed material properties can be easily manufactured by collective compression bonding using thermocompression bonding.

Generally, a conductor wire is laminated on at least one surface or both surfaces of the thermoplastic resin sheet constituting the first resin sheet. Similarly, a conductor wire is generally laminated on at least one surface or both surfaces of the thermoplastic resin sheets constituting the second resin sheet.

The conductor wire can be formed by a known wire formation method, using various known materials in the field of printed wiring substrates. Examples of the wire formation method include a method of bonding conductor foil on a surface of a thermoplastic resin sheet, or directly overlaying conductor foil on a surface of a thermoplastic resin sheet without using an adhesive (i.e., laminating conductor foil), and thereafter etching the conductor foil to form a wire circuit, a method of compression-bonding conductor foil formed in the shape of a wire circuit to a thermoplastic resin sheet, and a method of forming a circuit on a surface of a thermoplastic resin sheet by metal plating.

The conductor wires (in-plane conductors) may be electrically connected by a via conductor formed in a thermoplastic resin sheet, as necessary. The via conductor can be formed, for example, by forming a via hole at a prescribed position in the thermoplastic resin sheet having a conductor wire formed thereon, and filling the via hole with a conductive paste by screen printing, vacuum filling, or the like.

Examples of a method for forming a via hole include a method of drilling a hole by emitting a carbon dioxide laser from a side opposite to a surface having a conductor wire formed thereon. Thereafter, a smear (residual resin) remaining in the via hole produced by laser machining is removed by general-purpose chemical solution treatment using permanganic acid or the like, as necessary.

As the conductive paste charged into the via hole, various known conductive pastes can be used. Examples of the conductive paste include a paste formed by kneading metal powder and a flux component. Examples of the metal powder include metal powder containing at least one of Ag, Cu, and Ni and at least one of Sn, Bi, and Zn. Examples of the flux component include a vehicle, a solvent, a thixotropic agent, an activator, and the like.

The rigid-flexible substrate in accordance with a preferred embodiment of the present invention includes a plurality of rigid portions, and a flexible portion connecting the plurality of rigid portions. The flexible portion includes a portion of the first resin sheet on which the second resin sheet is not laminated. The rigid portion includes a portion of the first resin sheet other than the flexible portion, and the second resin sheet laminated on one surface or both surfaces of this portion (i.e., the portion of the first resin sheet other than the flexible portion). That is, the first resin sheet is a common member constituting the flexible portion and the rigid portion, and the second resin sheet is a member constituting the rigid portion only.

In the rigid-flexible substrate in accordance with a preferred embodiment of the present invention, a tapered portion is provided at an end edge of the second resin sheet on a side close to the flexible portion. One of the unique features of a preferred embodiment of the present invention is that a thickness of the tapered portion (i.e., a length in a lamination direction) decreases toward the flexible portion and is substantially 0 at a position in contact with the flexible portion. As a result, a boundary between the rigid portion and the flexible portion has a smooth shape, and thus flex resistance and rupture strength of a boundary portion between the flexible portion and the rigid portion is significantly improved, so as to prevent cracking, breaking or peeling-off of the conductor wire, in the boundary portion between the rigid portion and the flexible portion.

It is noted that the rigid-flexible substrate in accordance with a preferred embodiment of the present invention is preferably a rigid-flexible substrate fabricated by laminating a plurality of thermoplastic resin sheets including conductor wire layers and via conductors formed therein as necessary, and thermocompression-bonding the thermoplastic resin sheets by a collective multilayer pressing technique.

Preferred Embodiment 1

Figure 2:
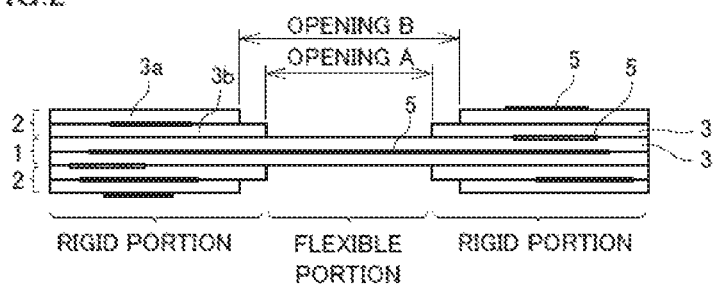
FIG. 2 is a schematic cross sectional view illustrating a method for manufacturing the rigid-flexible substrate according to Preferred Embodiment 1 of the present invention.

In the present preferred embodiment, a description will be given of a rigid-flexible substrate in a case where, of the plurality of thermoplastic resin sheets constituting the second resin sheet, a thermoplastic resin sheet closer to the first resin sheet has a longer length in a direction perpendicular or substantially perpendicular to a boundary surface between the flexible portion and the rigid portion, with reference to FIGS. 1 and 2. FIG. 1 is a schematic cross sectional view of a rigid-flexible substrate in Preferred Embodiment 1. FIG. 2 is a schematic cross sectional view showing the rigid-flexible substrate in Preferred Embodiment 1 in a state before lamination pressing.

As shown in FIG. 1, in the rigid-flexible substrate in the present preferred embodiment, second resin sheets 2 each including two layers of thermoplastic resin sheets 3 are laminated on a portion of both surfaces of a first resin sheet 1 including two layers of thermoplastic resin sheets 3 (i.e., a portion serving as a rigid portion). A tapered portion 21 is provided at an end edge of second resin sheet 2 on a side close to a flexible portion (i.e., a portion composed of first resin sheet 1 only), and a thickness of tapered portion 21 in a direction in which second resin sheet 2 is laminated (i.e., a vertical direction in the drawing) decreases toward the flexible portion and is substantially 0 at a position in contact with the flexible portion. As a result, the boundary between the rigid portion and the flexible portion has a smooth shape.

To manufacture the rigid-flexible substrate in the present preferred embodiment, as shown in FIG. 2, firstly, second resin sheets 2 are laminated on a portion of the both surfaces of first resin sheet 1 (i.e., a portion serving as a rigid portion). Next, by thermocompression-bonding the laminated first resin sheet and second resin sheets, the thermoplastic resin sheets are collectively compression-bonded, and thus the rigid-flexible substrate can be obtained.

Here, as shown in FIG. 2, of the plurality of thermoplastic resin sheets 3 constituting second resin sheet 2, a thermoplastic resin sheet 3b laminated on a side closer to first resin sheet 1 has a length in the direction perpendicular or substantially perpendicular to the boundary surface between the flexible portion and the rigid portion (i.e., a horizontal direction in the drawing) which is longer than that of a thermoplastic resin sheet 3a laminated on a side farther from first resin sheet 1. That is, an opening B in thermoplastic resin sheet 3a laminated on the side farther from first resin sheet 1 is larger in size than an opening A in thermoplastic resin sheet 3b laminated on the side closer to first resin sheet 1. By performing thermocompression bonding in such a lamination state under appropriate conditions which allows the resin of thermoplastic resin sheet 3 to flow partially, a tapered portion 21 is formed at the end edge of second resin sheet 2 on the side close to the flexible portion.

Preferably, the laminated plurality of thermoplastic resin sheets are collectively compression-bonded at a relatively low temperature, and the maximum temperature is preferably less than or equal to about 300° C., for example. This is because, if the thermoplastic resin sheets are compression-bonded at a higher temperature than necessary, the thermoplastic resin flows excessively and the tapered portion in a desired shape cannot be obtained. In addition, if the temperature exceeds about 300° C., the resin may flow out particularly when the thermoplastic resin sheets contain an LCP. Further, the temperature for thermocompression bonding reaches preferably more than or equal to about 230° C., and more preferably about 270° C. to about 290° C., for example, for at least a certain period of time.

When thermoplastic resin sheets 3 are collectively compression-bonded, they are preferably pressurized in a direction in which they are laminated. For example, they can be pressurized under a certain pressure by pressing them from both sides using pressing plates having shapes changed in accordance with thicknesses of the rigid portions and the flexible portion in the lamination direction. A pressing pressure of about 1 MPa to about 10 MPa (for example, about 4 MPa), for example, is preferable.

A conductor wire 5 may be laminated on at least one surface or both surfaces of thermoplastic resin sheets 3 constituting the first resin sheet 1, or at least one surface or both surfaces of thermoplastic resin sheets 3 constituting the second resin sheet 2, as necessary.

Further, these conductor wires (in-plane conductors) may be electrically connected by a via conductor located in thermoplastic resin sheet 3, as necessary. In this case, during thermocompression bonding, the resin of thermoplastic resin sheet 3 flows, whereas the via conductor sandwiched between the conductor wires (such as copper foils) is less likely to move. It is noted that, even when the via conductor flows during thermocompression bonding, electric conduction can be obtained by taking a measure such as setting the diameter of a lower via conductor to be larger than that of an upper via conductor, or slightly displacing a lower via conductor outward with respect to an upper via conductor.

A flat electrode may be provided on at least a portion of a surface of the rigid portion. Further, a surface of the planar electrode other than a portion connected to another electronic component may be covered with a solder resist. In addition, an exposed surface of the planar electrode may be plated with Ni, Au, or the like.

It is noted that the arrangement of the rigid portion and the flexible portion is not limited to the arrangement in only one direction as shown in FIG. 1, and, for example, a two-dimensional arrangement also including the rigid portion and the flexible portion in a direction perpendicular or substantially perpendicular to the paper plane may also be adopted.

In a case where the rigid-flexible substrate is an aggregate substrate including a plurality of sub substrates, the sub substrates can be obtained by cutting the aggregate substrate by, for example, laser light emission or punching.

Preferred Embodiment 2

Figure 3:
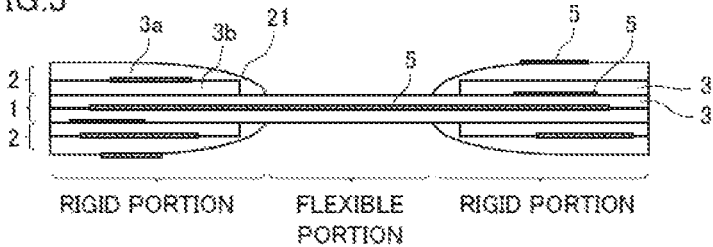
FIG. 3 is a schematic cross sectional view of a rigid-flexible substrate according to Preferred Embodiment 2 of the present invention.
Figure 4:
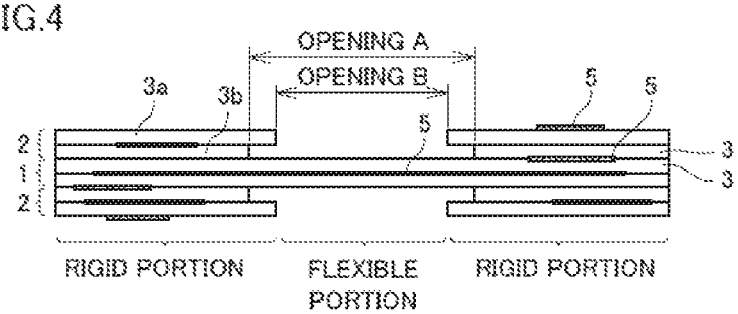
FIG. 4 is a schematic cross sectional view illustrating a method for manufacturing the rigid-flexible substrate according to Preferred Embodiment 1 of the present invention.
Figure 5:
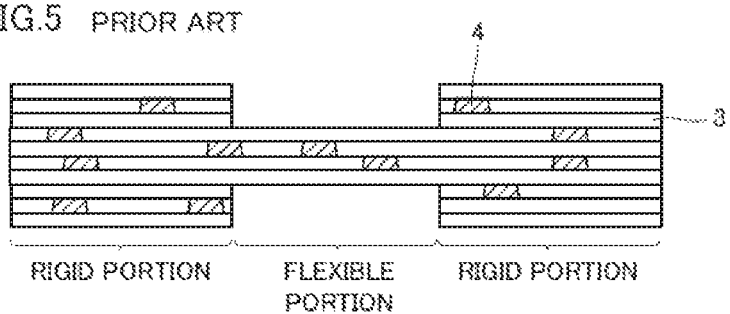
FIG. 5 is a schematic cross sectional view of a conventional rigid-flexible substrate.

In the present preferred embodiment, a description will be given of a rigid-flexible substrate in a case where a surface of the second resin sheet which is not in contact with the first resin sheet is entirely covered with an outermost thermoplastic resin sheet constituting the second resin sheet, with reference to FIGS. 3 and 4. FIG. 3 is a schematic cross sectional view of a rigid-flexible substrate in Preferred Embodiment 2. FIG. 4 is a schematic cross sectional view showing the rigid-flexible substrate in Preferred Embodiment 2 in a state before lamination pressing. It is noted that, regarding the content identical to that in Preferred Embodiment 1, the description thereof will not be repeated partially.

As shown in FIG. 3, in the rigid-flexible substrate in the present preferred embodiment, second resin sheets 2 each including two layers of thermoplastic resin sheets 3 are laminated on a portion of both surfaces of first resin sheet 1 including two layers of thermoplastic resin sheets 3 (i.e., a portion serving as a rigid portion). Tapered portion 21 is provided at an end edge of second resin sheet 2 on a side close to a flexible portion, and a thickness of tapered portion 21 in a direction in which second resin sheet 2 is laminated (i.e., a vertical direction in the drawing) decreases toward the flexible portion and is substantially 0 at a position in contact with the flexible portion. As a result, the boundary between the rigid portion and the flexible portion has a smooth shape.

To manufacture the rigid-flexible substrate in the present preferred embodiment, as shown in FIG. 4, firstly, second resin sheets 2 are laminated on a portion of the both surfaces of first resin sheet 1 (i.e., a portion serving as a rigid portion). Next, by thermocompression-bonding the laminated first resin sheet and second resin sheets, the thermoplastic resin sheets are collectively compression-bonded, and thus the rigid-flexible substrate is obtained.

Here, as shown in FIG. 4, of the plurality of thermoplastic resin sheets constituting the second resin sheet, outermost thermoplastic resin sheet 3a has a length in a direction perpendicular or substantially perpendicular to a boundary surface between the flexible portion and the rigid portion which is longer than that of another thermoplastic resin sheet 3b constituting the second resin sheet. That is, opening B in thermoplastic resin sheet 3a laminated as an outermost layer of second resin sheet 2 is smaller in size than opening A in underlying thermoplastic resin sheet 3b. By performing thermocompression bonding in such a lamination state under appropriate conditions which allows the resin of thermoplastic resin sheet 3 to flow partially, tapered portion 21 is provided at the end edge of second resin sheet 2 on the side close to the flexible portion.

It should be understood that the preferred embodiments disclosed herein are illustrative and non-restrictive in every respect. The scope of the present invention is defined by the scope of the claims, rather than the description above, and is intended to include any modifications within the scope and meaning equivalent to the scope of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A rigid-flexible substrate, comprising:
a plurality of rigid portions; and
a flexible portion connecting the plurality of rigid portions; wherein
the flexible portion is composed only of a first portion of a first resin sheet, the first resin sheet being composed of at least one layer of a thermoplastic resin sheet;
each of the rigid portions includes a second portion of the first resin sheet other than the first portion of the first resin sheet defining the flexible portion, and a second resin sheet composed of a plurality of thermoplastic resin sheets laminated on one surface or both surfaces of the second portion of the first resin sheet;
a tapered portion is provided at an end edge of the second resin sheet on a side close to the flexible portion;
a thickness of the tapered portion in a direction in which the second resin sheet is laminated decreases toward the flexible portion and is substantially 0 at a position in contact with the flexible portion;
all of the at least one layer of the thermoplastic resin sheet constituting the first resin sheet is made of a material that is identical to a material from which the plurality of thermoplastic resin sheets constituting the second resin sheet are made;
a conductor wire is laminated on at least one surface of the plurality of thermoplastic resin sheets constituting the second resin sheet; and
one of the plurality of thermoplastic resin sheets of the second resin sheet that is located farther from the first resin sheet has a longer distance from a boundary surface between the flexible portion and one of the rigid portions.

2. A rigid-flexible substrate, comprising:
a plurality of rigid portions; and
a flexible portion connecting the plurality of rigid portions; wherein
the flexible portion is composed only of a first portion of a first resin sheet, the first resin sheet being composed of at least one layer of a thermoplastic resin sheet;
each of the rigid portions includes a second portion of the first resin sheet other than the first portion of the first resin sheet defining the flexible portion, and a second resin sheet composed of a plurality of thermoplastic resin sheets laminated on one surface or both surfaces of the second portion of the first resin sheet;
a tapered portion is provided at an end edge of the second resin sheet on a side close to the flexible portion;
a thickness of the tapered portion in a direction in which the second resin sheet is laminated decreases toward the flexible portion and is substantially 0 at a position in contact with the flexible portion;
all of the at least one layer of the thermoplastic resin sheet constituting the first resin sheet is made of a material that is identical to a material from which the plurality of thermoplastic resin sheets constituting the second resin sheet are made;
a conductor wire is laminated on at least one surface of the plurality of thermoplastic resin sheets constituting the second resin sheet; and
a surface of the second resin sheet which is not in contact with the first resin sheet is entirely covered with an outermost thermoplastic resin sheet constituting the second resin sheet.

3. The rigid-flexible substrate according to claim 1, wherein a conductor wire is laminated on at least one surface of the thermoplastic resin sheet constituting the first resin sheet.

4. The rigid-flexible substrate according to claim 1, wherein the first resin sheet includes 1 to 10 layers of the thermoplastic resin sheet, and the second resin sheet includes 2 to 10 layers of the thermoplastic resin sheet.

5. The rigid-flexible substrate according to claim 1, wherein the thermoplastic resin sheet is made of one of a liquid crystal polymer, a polyether ketone resin, and a polyphenylene sulfide resin.

6. The rigid-flexible substrate according to claim 1, wherein the first resin sheet is a common member of the flexible portion and the rigid portions.

7. The rigid-flexible substrate according to claim 1, wherein the boundary surface is smooth.

8. A rigid-flexible substrate, comprising:
a plurality of rigid portions; and
a flexible portion connecting the plurality of rigid portions; wherein
the flexible portion is composed only of a first portion of a first resin sheet, the first resin sheet being composed of at least one layer of thermoplastic resin sheet;
each of the rigid portions includes a second portion of the first resin sheet other than the first portion of the first resin sheet defining the flexible portion, and a second resin sheet composed of a plurality of thermoplastic resin sheets laminated on one surface or both surfaces of the second portion of the first resin sheet;
a tapered portion is provided at an end edge of the second resin sheet on a side close to the flexible portion;
a thickness of the tapered portion in a direction in which the second resin sheet is laminated decreases toward the flexible portion and is substantially 0 at a position in contact with the flexible portion;
all of the at least one layer of the thermoplastic resin sheet constituting the first resin sheet is made of a material that is identical to a material from which the plurality of thermoplastic resin sheets constituting the second resin sheet; and
a conductor wire is laminated on at least one surface of the plurality of thermoplastic resin sheets constituting the second resin sheet; and
one of the plurality of thermoplastic resin sheets of the second resin sheet that is located closer to the first resin sheet has a longer length than another of the plurality of thermoplastic resin sheets of the second resin sheet that is farther from the first resin sheet than the one of the plurality of thermoplastic resin sheets in a direction perpendicular or substantially perpendicular to a boundary surface between the flexible portion and one of the rigid portions.

9. The rigid-flexible substrate according to claim 2, wherein a conductor wire is laminated on at least one surface of the thermoplastic resin sheet constituting the first resin sheet.

10. The rigid-flexible substrate according to claim 2, wherein the first resin sheet includes 1 to 10 layers of the thermoplastic resin sheet, and the second resin sheet includes 2 to 10 layers of the thermoplastic resin sheet.

11. The rigid-flexible substrate according to claim 2, wherein the thermoplastic resin sheet is made of one of a liquid crystal polymer, a polyether ketone resin, and a polyphenylene sulfide resin.

12. The rigid-flexible substrate according to claim 2, wherein the first resin sheet is a common member of the flexible portion and the rigid portions.

13. The rigid-flexible substrate according to claim 8, wherein a conductor wire is laminated on at least one surface of the thermoplastic resin sheet constituting the first resin sheet.

14. The rigid-flexible substrate according to claim 8, wherein the first resin sheet includes 1 to 10 layers of the thermoplastic resin sheet, and the second resin sheet includes 2 to 10 layers of the thermoplastic resin sheet.

15. The rigid-flexible substrate according to claim 8, wherein the thermoplastic resin sheet is made of one of a liquid crystal polymer, a polyether ketone resin, and a polyphenyiene sulfide resin.

16. The rigid-flexible substrate according to claim 8, wherein the first resin sheet is a common member of the flexible portion and the rigid portions.

* * * * *